(12) United States Patent
Lampert

(10) Patent No.: US 12,447,438 B2
(45) Date of Patent: Oct. 21, 2025

(54) ABATEMENT METHOD AND APPARATUS

(71) Applicant: Edwards Limited, Burgess Hill (GB)

(72) Inventor: Stuart Mark Lampert, Clevedon (GB)

(73) Assignee: Edwards Limited, Burgess Hill (GB)

( * ) Notice: Subject to any disclaimer, the term of this patent is extended or adjusted under 35 U.S.C. 154(b) by 557 days.

(21) Appl. No.: 17/413,311

(22) PCT Filed: Dec. 10, 2019

(86) PCT No.: PCT/GB2019/053487
§ 371 (c)(1),
(2) Date: Jun. 11, 2021

(87) PCT Pub. No.: WO2020/120947
PCT Pub. Date: Jun. 18, 2020

(65) Prior Publication Data
US 2022/0016572 A1    Jan. 20, 2022

(30) Foreign Application Priority Data
Dec. 13, 2018   (GB) ...................... 1820319

(51) Int. Cl.
*B01D 53/34*     (2006.01)
*B01D 53/70*     (2006.01)
(Continued)

(52) U.S. Cl.
CPC .......... *B01D 53/346* (2013.01); *B01D 53/70* (2013.01); *F23G 5/50* (2013.01); *F23G 7/065* (2013.01);
(Continued)

(58) Field of Classification Search
None
See application file for complete search history.

(56) References Cited

U.S. PATENT DOCUMENTS

| 10,329,668 B2 | 6/2019 | Franken et al. |
| 2005/0074375 A1 | 4/2005 | Reichardt et al. |

(Continued)

FOREIGN PATENT DOCUMENTS

| CN | 105874563 A | 8/2016 | |
| CN | 105674343 B | * 9/2018 | .............. F24C 3/085 |

(Continued)

OTHER PUBLICATIONS

British Examination Report dated Jun. 4, 2019 and Search Report dated May 30, 2018 for corresponding British Application No. GB1820319.0, 6 pages.

(Continued)

*Primary Examiner* — Jason Lau
(74) *Attorney, Agent, or Firm* — Theodore M. Magee; Westman, Champlin & Koehler, P.A.

(57) ABSTRACT

An abatement apparatus and method are disclosed. The abatement apparatus is for treating an effluent stream from a semiconductor processing tool and comprises: a first abatement device configured to receive the effluent stream and operable to run in an active mode to treat the effluent stream; a second abatement device operable to run in an idle mode; and control logic operable, on receipt of an indication of an alarm condition associated with the first abatement device, to run the second abatement device in the active mode. In this way, a first or primary abatement device is provided which treats the effluent stream and a second or back-up abatement device is provided, should the first abatement device malfunction. However, by only causing the second abatement device to operate in the active mode when the first abatement device malfunctions, significant energy savings can be made.

11 Claims, 1 Drawing Sheet

(51) Int. Cl.
   *F23G 5/50*     (2006.01)
   *F23G 7/06*     (2006.01)
(52) U.S. Cl.
   CPC .. *B01D 2257/2066* (2013.01); *F23G 2207/20* (2013.01); *F23G 2209/142* (2013.01); *F23G 2900/50001* (2013.01)

(56) References Cited

U.S. PATENT DOCUMENTS

| | | | |
|---|---|---|---|
| 2008/0290041 A1 | 11/2008 | Clark et al. | |
| 2009/0216061 A1 | 8/2009 | Clark et al. | |
| 2009/0235645 A1* | 9/2009 | Noda | F01N 13/009 60/299 |
| 2009/0263755 A1* | 10/2009 | Nigro | F23D 14/68 431/202 |
| 2013/0008311 A1 | 1/2013 | Ohuchi et al. | |

FOREIGN PATENT DOCUMENTS

| | | | | |
|---|---|---|---|---|
| GB | 2533293 A | * | 6/2016 | F23D 14/12 |
| JP | S62237929 A | | 10/1987 | |
| JP | H05267181 A | | 10/1993 | |
| JP | H07275659 A | | 10/1995 | |
| JP | H08330292 A | | 12/1996 | |
| JP | H11197440 A | | 7/1999 | |
| JP | H11233444 A | | 8/1999 | |
| JP | 2000249339 A | * | 9/2000 | |
| JP | 2007029790 A | | 2/2007 | |
| JP | 2007253098 A | | 10/2007 | |
| JP | 2010528475 A | | 8/2010 | |
| JP | 2011189228 A | | 9/2011 | |
| JP | 2015052420 A | | 3/2015 | |
| TW | 500622 B | | 9/2002 | |
| TW | 546164 B | | 8/2003 | |
| TW | 200831178 A | | 8/2008 | |
| TW | 201328768 A | | 7/2013 | |
| WO | 2006083356 A2 | | 8/2006 | |
| WO | 2007119077 A2 | | 10/2007 | |
| WO | 2008024446 A2 | | 2/2008 | |
| WO | 2010024216 A1 | | 3/2010 | |

OTHER PUBLICATIONS

PCT Notification of Transmittal of the International Search Report and the Written Opinion of the International Searching Authority, or the Declaration dated Feb. 19, 2020, PCT Search Report for corresponding PCT Application No. PCT/GB2019/053487, 5 pages.
PCT Written Opinion dated Feb. 19, 2020 for corresponding PCT Application No. PCT/GB2019/053487, 5 pages.
Chinese First Office Action dated Mar. 20, 2023 for corresponding Chinese application Serial No. 201980082585.7.
Japanese Notification for Reason for Rejection dated Jul. 24, 23 for corresponding Japanese application Serial No. JP2021-533476, 6 pages.
Taiwanese Office Action dated May 23, 2023 and Search Report dated May 22, 2023 for corresponding Taiwanese application Serial No. TW108145753, 17 pages.
Japanese Second Office Action dated Oct. 31, 2023 and Search Report dated Oct. 27, 2023 for corresponding Japanese application Serial No. JP201980082585.7, 31 pages.
Taiwanese Office Action and Search Report dated Oct. 18, 2023 for corresponding Taiwanese application Serial No. TW108145753, 18 pages.
Tong, Space Launch Pollution Control, The Second Five-Year unified textbook for military training of the General Armament Unit, 2013, 32 pages.

* cited by examiner

ABATEMENT METHOD AND APPARATUS

CROSS-REFERENCE OF RELATED APPLICATION

This application is a Section 371 National Stage Application of International Application No. PCT/GB2019/053487, filed Dec. 10, 2019, and published as WO 2020/120947A1 on Jun. 18, 2020, the content of which is hereby incorporated by reference in its entirety and which claims priority of British Application No. 1820319.0, filed Dec. 13, 2018.

FIELD

The field of the invention relates to an abatement apparatus and method.

BACKGROUND

Abatement apparatus are known and are typically used for treating an effluent gas stream from a manufacturing process tool used in, for example, the semiconductor or flat panel display manufacturing industry. During such manufacturing, residual perfluorinated compounds (PFCs) and other compounds exist in the effluent gas stream pumped from the process tool. PFCs are difficult to remove from the effluent gas and their release into the environment is undesirable because they are known to have relatively high greenhouse activity.

Known abatement apparatus use heat, typically provided by combustion to remove the PFCs and other compounds from the effluent gas stream. Typically, the effluent gas stream is a nitrogen stream containing PFCs and other compounds. When using combustion to provide the heat, a fuel gas is mixed with the effluent gas stream and that gas stream mixture is conveyed into a combustion chamber that is laterally surrounded by the exit surface of a foraminous gas burner. Fuel gas and air are simultaneously supplied to the foraminous burner to affect flameless combustion at the exit surface, with the amount of air passing through the foraminous burner being sufficient to consume not only the fuel gas supplied to the burner, but also all the combustibles in the gas stream mixture injected into the combustion chamber.

Although such abatement apparatus for processing the effluent gas stream exist, they each have their own shortcomings. Accordingly, it is desired to provide an improved abatement apparatus.

The discussion above is merely provided for general background information and is not intended to be used as an aid in determining the scope of the claimed subject matter. The claimed subject matter is not limited to implementations that solve any or all disadvantages noted in the background.

SUMMARY

According to a first aspect, there is provided an abatement apparatus for treating an effluent stream from a semiconductor processing tool, comprising: a first abatement device configured to receive the effluent stream and operable to run in an active mode to treat the effluent stream; a second abatement device operable to run in an idle mode; and control logic operable, on receipt of an indication of an alarm condition associated with the first abatement device, to run the second abatement device in the active mode.

The first aspect recognises that a problem with existing arrangements is that were an abatement device to malfunction, causing a possible loss of abatement, then it may be necessary for the processing being performed by the processing tool which generates the effluent stream to be interrupted, which is undesirable. Accordingly, an abatement apparatus is provided. The abatement apparatus may treat an effluent stream provided by a processing tool. The apparatus may comprise a first abatement device. The first abatement device may receive the effluent stream. The first abatement device may be run or operated in an active, operational or abatement mode in order to treat or abate compounds in the effluent stream. The abatement apparatus may comprise a second abatement device. The second abatement device may be run or operated in an idle, non-operational or non-abatement mode. The abatement apparatus may comprise control logic or a controller. The control logic may receive an indication or a signal identifying an alarm condition experienced by the first abatement device. The control logic may then run or operate the second abatement device in the active mode. In this way, a first or primary abatement device is provided which treats the effluent stream and a second or back-up abatement device is provided, should the first abatement device malfunction. However, by only causing the second abatement device to operate in the active mode when the first abatement device malfunctions, significant energy savings can be made.

In one embodiment, the alarm condition indicates that an operational characteristic of the first abatement device has varied more than a threshold amount. Accordingly, the alarm condition may indicate that a malfunction has occurred since the operational parameters of the first abatement device has deviated outside an expected operating range.

In one embodiment, the operational characteristic comprises a pressure.

In one embodiment, the operational characteristic comprises a flow rate.

In one embodiment, the operational characteristic comprises a sensor error.

In one embodiment, the operational characteristic comprises a valve error.

In one embodiment, the apparatus comprises a divert valve operable to supply the effluent stream to one of the first abatement device and the second abatement device. Accordingly, the divert valve may be, for example, a three-port valve which can only supply the effluent stream to either the first abatement device or the second abatement device.

In one embodiment, the control logic is operable to control the divert valve to supply the effluent stream to the second abatement device following receipt of the indication of the alarm condition associated with the first abatement device Accordingly, the divert valve may be operated to supply the effluent stream to the second abatement device at a time after the alarm condition has been received.

In one embodiment, the control logic is operable to receive an indication of a mode status of the second abatement device and to control the divert valve to supply the effluent stream to the second abatement device when the indication of a mode status indicates that the second abatement device is running in the active mode. Accordingly, the control logic may receive an indication of the mode or operational status of the second abatement device. The control logic may operate the divert valve only when the second abatement device has been confirmed to be operating in the active or operational mode. This ensures that the effluent stream is not supplied to the second abatement device prior to it being ready to treat that effluent stream.

In one embodiment, the indication of the mode status of the second abatement device is determined from an indication of a temperature of the second abatement device. Accordingly, the control logic may be provided with a signal identifying the temperature of the second abatement device. This ensures that the effluent stream is not supplied to the second abatement device prior to it being ready to treat that effluent stream.

In one embodiment, the control logic is operable shutdown the first abatement device following operation of the divert valve to supply the effluent stream to the second abatement device.

In one embodiment, the apparatus comprises a bypass valve upstream of the divert valve, and wherein the alarm condition has a divert time associated therewith and the control logic is operable to activate the bypass valve to prevent supply of the effluent stream to the divert valve should the second abatement device fail to switch from the idle mode to the active mode within the divert time. Accordingly, a bypass valve may be provided. Each alarm condition may be associated with a predetermined or known time period. The control logic may operate the bypass valve to cease supply of the effluent stream when the second abatement device does not achieve the active or operational mode within that time period. In this way, the effluent stream is prevented from being supplied to either of the abatement devices since the first abatement device is likely to have failed and be unable to treat the effluent stream, while the second abatement device is likewise inoperative and so unable to treat the effluent stream. Instead, the effluent stream will be accommodated elsewhere.

In one embodiment, the control logic is operable to deactivate the bypass valve to supply the effluent stream to the divert valve upon receipt of an indication that the second abatement device is running in the active mode. Once the second abatement device is operational, the effluent stream may then be diverted to it for treatment.

In one embodiment, the apparatus comprises a first isolation valve between the divert valve and the first abatement device.

In one embodiment, the control logic is operable to activate the first isolation valve to prevent supply of the effluent stream to the first abatement device following activation of the divert valve to supply the effluent stream to the second abatement device.

According to a second aspect, there is provided a method of treating an effluent stream from a semiconductor processing tool, comprising: providing the effluent stream to a first abatement device running in an active mode to treat the effluent stream; providing a second abatement device running in an idle mode; and on receipt of an indication of an alarm condition associated with the first abatement device running the second abatement device in the active mode.

In one embodiment, the alarm condition indicates that an operational characteristic of the first abatement device has varied more than a threshold amount.

In one embodiment, the operational characteristic comprises at least one of a pressure, a flow rate, a sensor error and a valve error.

In one embodiment, the method comprises providing a divert valve operable to supply the effluent stream to one of the first abatement device and the second abatement device.

In one embodiment, the method comprises controlling the divert valve to supply the effluent stream to the second abatement device following receipt of the indication of the alarm condition associated with the first abatement device.

In one embodiment, the method comprises receiving an indication of a mode status of the second abatement device and controlling the divert valve to supply the effluent stream to the second abatement device when the indication of a mode status indicates that the second abatement device is running in the active mode.

In one embodiment, the method comprises determining the indication of the mode status of the second abatement device from an indication of a temperature of the second abatement device.

In one embodiment, the method comprises shutting-down the first abatement device following operation of the divert valve to supply the effluent stream to the second abatement device.

In one embodiment, the method comprises providing a bypass valve upstream of the divert valve, and wherein the alarm condition has a divert time associated therewith and the method comprises activating the bypass valve to prevent supply of the effluent stream to the divert valve should the second abatement device fail to switch from the idle mode to the active mode within the divert time.

In one embodiment, the method comprises deactivating the bypass valve to supply the effluent stream to the divert valve upon receipt of an indication that the second abatement device is running in the active mode.

In one embodiment, the method comprises providing a first isolation valve between the divert valve and the first abatement device.

In one embodiment, the method comprises activating the first isolation valve to prevent supply of the effluent stream to the first abatement device following activation of the divert valve to supply the effluent stream to the second abatement device.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Before discussing the embodiments in any more detail, first an overview will be provided. Embodiments provide an arrangement whereby two or more abatement devices (such as combustion chambers) are provided downstream from a processing chamber of a processing tool generating an effluent stream. Typically, one of the abatement devices is operated as a primary abatement device and is activated by having the abatement chamber raised to a suitable operating temperature for abatement to occur. Meanwhile, a second abatement device remains inactive, typically in an idle mode, ready to be activated and is activated when a problem is detected with the operation of the primary abatement device. Once the secondary abatement device is operating correctly, the effluent stream supplied from the process tool ceases to be supplied to the primary abatement device and instead is supplied to the secondary abatement device. This provides for the seamless operation of the processing tool without interruption, even when operating issues arise with the abatement system.

Abatement Apparatus

Figure 1:
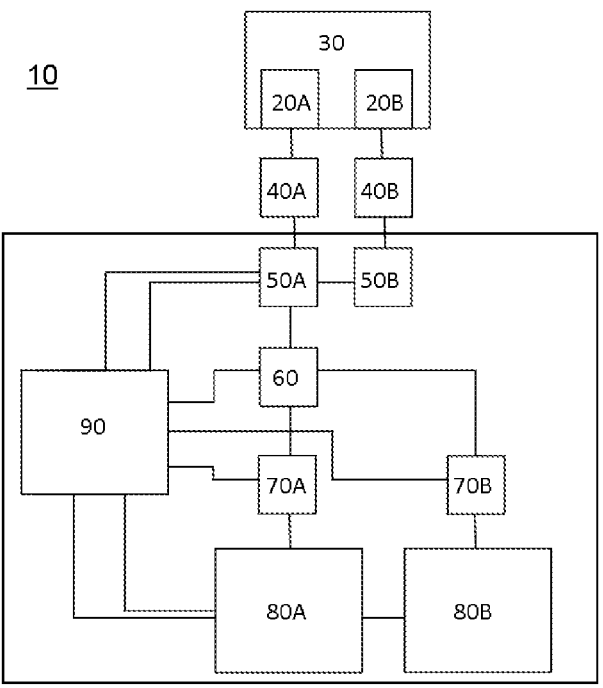
FIG. 1 illustrates an abatement apparatus according to one embodiment.

FIG. 1 illustrates an abatement apparatus 10 according to one embodiment. The abatement apparatus 10 couples with processing chambers 20A, 20B of a processing tool 30. Pumps 40A, 40B couple upstream with an associated processing chamber 20A, 20B and couple downstream with an associated bypass valve 50A, 50B. The bypass valves 50A, 50B couple downstream with a divert valve 60. The divert valve 60 couples downstream with isolation valves 70A, 70B. The isolation valve 70A couples downstream with a first abatement device 80A. The isolation valve 70B couples downstream with a second abatement device 80B.

Control logic 90 couples with sensors within the first abatement device 80A and the second abatement device 80B. The sensors typically provide parametric data regarding the operation of the abatement devices 80A, 80B, that data is processed by the control logic 90. Alternatively, it will be appreciated that the sensors may be configured to only report values out of range to the control logic. The control logic 90 is coupled to provide signals to control the bypass valves 50A, 50B, the divert valve 60, the isolation valves 70A, 70B, the first abatement device 80A and the second abatement device 80B.

Figure 2:
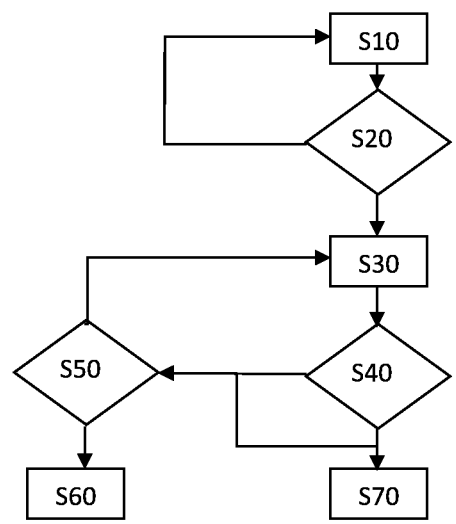
FIG. 2 is a flow chart showing the main processing steps performed by the abatement apparatus of FIG. 1.

The operation of the abatement apparatus 10 will now be described with reference to FIG. 2. At step S10, the control logic 90 sends a signal to the first abatement device 80A to move to an active or operational state in which it is able to receive and abate the effluent stream from the processing tool 30. The control logic 90 sends a signal to the second abatement device 80B to move to an idle state, typically causing pilot to ignite but not supplying the main fuel and oxidant. Accordingly, the first abatement device 80A heats up to an operating temperature and the second abatement device 80B pre-warms. If the isolation valve 70A is in an isolated position, then the control logic 90 switches this to a non-isolated position to couple the first abatement device 80A with the divert valve 60. The control logic controls the divert valve 60 to couple the first abatement device 80A with the bypass valves 50A, 50B. Hence, the first abatement device 80A is ready to process any effluent stream provided from the processing tool 30 and the second abatement device is in a stand-by state.

Abatement of the effluent stream continues until the processing occurring within the processing tool 30 completes or an alarm condition is detected within the first abatement device 80A. In particular, at step S20, the control logic 90 operates to detect any of the alarm conditions described in Table 1.

TABLE 1

| Drain water high alarm | Abatement alarm | 10 sec |
| Water low pressure alarm | Abatement alarm | 10 sec |

TABLE 1-continued

| Quench high water flow | Abatement alarm | 10 sec |
| Quench low water flow | Abatement alarm | 10 sec |
| Quench water flow transducer error | Abatement alarm | 10 sec |
| Packed tower high water flow | Abatement alarm | 10 sec |
| Packed tower water flow transducer error | Abatement alarm | 10 sec |
| Weir high water flow | Abatement alarm | 10 sec |
| Weir water flow transducer error | Abatement alarm | 10 sec |
| Fuel/air low differential pressure | Abatement alarm | 10 sec |
| Fuel gas high pressure alarm | Abatement alarm | 10 sec |
| Regulated fuel gas low pressure alarm | Abatement alarm | 10 sec |
| Bypass valve position fault: inlets 1 to 6 | Bypass alarm | 10 sec |
| LS609/610 drain tank water level-sensor error | Abatement alarm | 30 sec |
| LS601/610 drain tank water level-sensor error | Abatement alarm | 30 sec |
| Packed tower low water flow | Abatement alarm | 5 sec |
| Weir low water flow | Abatement alarm | 5 sec |
| Excess air high flow alarm **** | Abatement alarm | 5 sec |
| Excess air low flow alarm **** | Abatement alarm | 5 sec |
| Excess air flow error **** | Abatement alarm | 5 sec |

On the occurrence of any of those alarm conditions, at step S30, the control logic 90 sends a signal to the second abatement device 80B to cause it to switch to an operational or active mode. In particular, the control logic 90 causes the temperature within the second abatement device 80B to increase. Although various techniques can be envisaged for determining whether the second abatement device 80B is in its operational or active mode and has achieved the operating temperature, in this embodiment a temperature sensor monitors whether the temperature within the second abatement device 80B has increased in response to the activation signal by more than 50° C.

Each alarm condition has a timeframe associated therewith. The timeframe defines the amount of time between an alarm condition being detected and a possible failure occurring in the first abatement device 80A. Accordingly, at step S40, a determination is made of whether that timer has expired. If the timer has not expired, then the control logic determines, at step S50, whether the second abatement device 80B is active. Should the second abatement device 80B not be active and ready to receive a diverted effluent stream then there is a risk that the first abatement device 80A will have failed and the effluent stream will be insufficiently abated.

Accordingly, should the control logic 90 determine that the second abatement device 80B is not yet in the active mode when the timeframe expires, then, at step S60, the control logic 90 will activate the bypass valves 50A, 50B which prevents the effluent stream from being provided to the abatement apparatus 10 and instead supplies the effluent stream to other infrastructure for capture and/or processing. The control logic 90 will typically also cause additional nitrogen to be provided to the pumps 40A, 40B and to be mixed with the effluent stream being provided by the bypass valves 50A, 50B to ensure that any components within the effluent stream remain below their lower flammable limit. The control logic 90 will also typically activate a warning.

Should the second abatement device 80B achieve its active or operational mode then, at step S70, the control logic 90 deactivates any active bypass valves 50A, 50B. The control logic 90 ensures that the isolation valve 70B is set to couple the second abatement device 80B with the divert valve 60. The control logic 90 then operates the divert valve 60 to divert the effluent stream from the first abatement device 80A to the second abatement device 80B. The control logic 90 then activates the isolation valve 70A to isolate the first abatement device 80A from the divert valve 60. The control logic 90 then sends a signal to shut down the first abatement device 80A. Maintenance on the first abatement device 80A can then occur.

Hence, it can be seen that in one embodiment, when an alarm condition occurs on first abatement device 80A the switch over process to second abatement device 80B should occur without interruption to the production tool. However, second abatement device 80B is not available instantaneously as proof of burner should be sensed by reading a 50° C. increase in burner temperature. The system or individual inlet will typically go to bypass mode whilst second abatement device 80B is started.

In one embodiment, abatement alarms have a timeout, e.g. water flow alarm of 10s. This timeout can be used to trigger the second abatement device 80B to start up from idle mode. If second abatement device 80B is then ready before the alarm timeout expires switchover to second abatement device 80B is seamless.

One embodiment envisages a twin abatement concept which refers to two abatement systems coupled to one process tool with a single or multiple vacuum pumps; typically 6 pumps max. There is a primary and backup abatement whereby the primary has 100% of the process chamber gas loading. The backup abatement remains in an idle mode until required to take over all of the process gas load.

Typically, additional 3-way process ball valves are required to provide a divert switching function 60 from device 80A to device 80B (per pump exhaust line) whenever device 80A enters alarm condition.

The switchover procedure controls the bypass valves 50A, 50B, the divert valve 60, the abatement device 80A isolation valve and the abatement device 80B isolation valve.

During the first abatement device 80A alarm timeout period, second abatement device 80B burner is established. Once an appropriate temperature increase is reached the divert valve 60 switches towards abatement device 80B. Isolation valves 70B will be open once the second abatement device 80B is started and there are no alarms present. Idle is not an alarm condition.

This approach pre-empts the failure of a critical system and enables a backup system to finish the wafer batch. Knowing the alarm timeout means a seamless switch of process gas can occur without causing a warning or alarm condition at the process tool or chamber. If the alarm timeout period is insufficient to seamlessly switch the backup, there are two other interlocked devices. A nitrogen dilution module (not shown) can deliver 50-500 slm purge into the vacuum pump exhaust to dilute process gases to < lower flammable limit. A nitrogen flow switch (not shown) ensures the vacuum pump has sufficient nitrogen flow. These devices are interlocked to the tool or chamber. Providing both devices are healthy, the tool will receive a warning indication (soft shutdown). Once the backup abatement become available the warning signal is removed. If the backup abatement does not become available or either of the additional interlocked devices fails, the tool will receive an alarm indication (hard shutdown).

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. An abatement apparatus for treating an effluent stream from a semiconductor processing tool, comprising:
a first abatement device configured to receive said effluent stream and operable to run in an active mode to treat said effluent stream wherein the active mode of the first abatement device comprises supplying fuel gas to a foraminous burner in the first abatement device to affect flameless combustion along an exit surface of the foraminous burner;
a second abatement device operable to run in an idle mode and an active mode wherein the idle mode comprises maintaining a pilot light but not supplying fuel gas to a second foraminous burner in the second abatement device and the active mode of the second abatement device comprises supplying fuel gas to the second foraminous burner in the second abatement device to affect flameless combustion along an exit surface of the second foraminous burner;
a divert valve operable to supply said effluent stream to one of said first abatement device and said second abatement device;
a bypass valve upstream of said divert valve; and
control logic operable, on receipt of an indication of an alarm condition associated with said first abatement device, to switch said second abatement device from running in the idle mode to running in the active mode of the second abatement device;
wherein said alarm condition has a divert time associated therewith and said control logic is operable to activate said bypass valve to prevent supply of said effluent stream to said divert valve should said second abatement device fail to switch from said idle mode to said active mode of the second abatement device within said divert time.

2. The abatement apparatus of claim 1, wherein said alarm condition indicates that an operational characteristic of said first abatement device has varied more than a threshold amount.

3. The abatement apparatus of claim 2, wherein said operational characteristic comprises at least one of a pressure, a flow rate, a sensor error and a valve error.

4. The abatement apparatus of claim 1, wherein said control logic is operable to control said divert valve to supply said effluent stream to said second abatement device following receipt of said indication of said alarm condition associated with said first abatement device.

5. The abatement apparatus of claim 1, wherein said control logic is operable to receive an indication of a mode status of said second abatement device and to control said divert valve to supply said effluent stream to said second abatement device when said indication of a mode status indicates that said second abatement device is running in said active mode of the second abatement device.

6. The abatement apparatus of claim 5, wherein said indication of said mode status of said second abatement device is determined from an indication of a temperature of said second abatement device.

7. The abatement apparatus of claim 1, wherein said control logic is operable to shutdown said first abatement device following operation of said divert valve to supply said effluent stream to said second abatement device.

8. The abatement apparatus of claim 1, wherein said control logic is operable to deactivate said bypass valve to supply said effluent stream to said divert valve upon receipt of an indication that said second abatement device is running in said active mode of the second abatement device.

9. The abatement apparatus of claim 1, comprising a first isolation valve between said divert valve and said first abatement device.

10. The abatement apparatus of claim 9, wherein said control logic is operable to activate said first isolation valve to prevent supply of said effluent stream to said first abatement device following activation of said divert valve to supply said effluent stream to said second abatement device.

11. A method for treating an effluent stream from a semiconductor processing tool, the method composing:
   providing a first abatement device configured to receive said effluent stream and operable to run in an active mode to treat said effluent stream wherein the active mode of the first abatement device comprises supplying fuel gas to a foraminous burner in the first abatement device to affect flameless combustion along an exit surface of the foraminous burner;
   providing a second abatement device operable to run in an idle mode and an active mode wherein the idle mode comprises maintaining a pilot light but not supplying fuel gas to a second foraminous burner in the second abatement device and the active mode of the second abatement device comprises supplying fuel gas to the second foraminous burner in the second abatement device to affect flameless combustion along an exit surface of the second foraminous burner;
   providing a divert valve operable to supply said effluent stream to one of said first abatement device and said second abatement device;
   providing a bypass valve upstream of said divert valve; and
   on receipt of an indication of an alarm condition associated with said first abatement device, switching said second abatement device from running in the idle mode to running in the active mode of the second abatement device;
   wherein said alarm condition has a divert time associated therewith and said bypass valve is activated to prevent supply of said effluent stream to said divert valve should said second abatement device fail to switch from said idle mode to said active mode of the second abatement device within said divert time.

* * * * *